United States Patent [19]

Kuroda et al.

[11] Patent Number: 4,564,766

[45] Date of Patent: Jan. 14, 1986

[54] METHOD FOR DRIVING SOLID STATE IMAGE PICKUP DEVICE

[75] Inventors: Takao Kuroda, Osaka; Kenju Horii, Shiga, both of Japan

[73] Assignee: Matsushita Electric Industrial Co., Ltd., Osaka, Japan

[21] Appl. No.: 701,648

[22] Filed: Feb. 14, 1985

Related U.S. Application Data

[63] Continuation of Ser. No. 370,049, Apr. 20, 1982.

[51] Int. Cl.[4] .............................................. H01L 27/14
[52] U.S. Cl. ...................................... 250/578; 357/24; 357/30; 358/213
[58] Field of Search ................... 250/578, 209, 211 J; 357/29, 30, 31, 32, 24 LR; 358/212, 213, 41

[56] References Cited

U.S. PATENT DOCUMENTS

| | | |
|---|---|---|
| 3,911,467 | 10/1975 | Levine et al. ................... 358/213 X |
| 3,932,775 | 1/1976 | Kosonocky ...................... 250/578 X |
| 4,012,587 | 3/1977 | Ochi et al. ............................ 357/24 |
| 4,237,383 | 12/1980 | Kosonocky et al. ................ 250/578 |
| 4,242,700 | 12/1980 | Weimer ............................... 358/213 |
| 4,322,752 | 3/1982 | Bixby ................................. 358/213 |
| 4,330,796 | 5/1982 | Anagnostopoulos et al. ..... 358/213 |
| 4,349,743 | 9/1982 | Ohba et al. .......................... 250/578 |

Primary Examiner—Edward P. Westin
Attorney, Agent, or Firm—Burgess, Ryan & Wayne

[57] ABSTRACT

A method for driving a solid state image pickup device is provided in which charges stored in a group of photoelectric conversion elements of odd rows are first discharged or read out, and then charges stored in a group of photoelectric conversion elements of even rows are read out or discharged, thereafter, the charges stored in the group of photoelectric conversion elements of even rows are first discharged or read out and then charges stored in the group of photoelectric conversion elements of odd rows and read out or discharged.

4 Claims, 6 Drawing Figures

METHOD FOR DRIVING SOLID STATE IMAGE PICKUP DEVICE

This application is a continuation of application Ser. No. 370,049 filed Apr. 20, 1982.

BACKGROUND OF THE INVENTION

1. Field of the Invention

The present invention relates to a method for driving a solid state image pickup device.

2. Description of the Prior Art

Two conventional methods, a frame integration method and a field integration method, have been proposed for driving a solid state image pickup device comprising photoelectric conversion elements which are arranged in arrays and readout sections for transferring charge stored in the photoelectric conversion elements and for detecting the charge.

Image resolution is excellent according to the frame integration method. However, with this method, an equivalent afterimage occurs due to the overlap of the integration period.

The field integration method is developed to solve the above problem of the frame integration method. However, the resolution according to this method is worse than that according to the frame integration method.

SUMMARY OF THE INVENTION

It is, therefore, an object of the present invention to provde a method for driving a solid state image pickup device wherein excellent resolution is maintained as in a frame integration method and simultaneously an equivalent afterimage is eliminated as in the field integration method.

According to the solid state image pickup device in accordance with the present invention, signal charges in a group of photoelectric conversion elements of odd rows are discharged or read out, and then signal charges in a group of photoelectric conversion elements of even rows are read out or discharged. Alternatively, the signal charges in a group of photoelectric conversion elements of even rows are discharged or read out and then signal charges in a group of photoelectric conversion elements of odd rows are read out or discharged.

DETAILED DESCRIPTION OF THE INVENTION

Detailed Description of the Prior art

Figure 1:
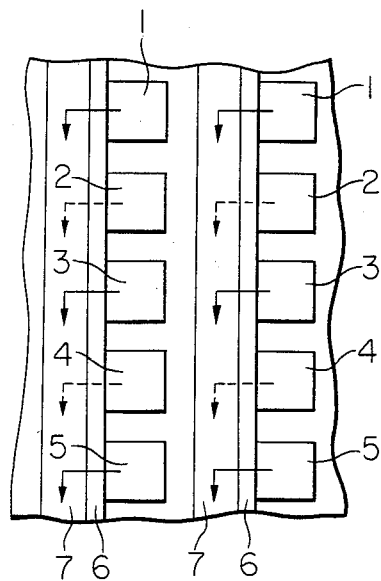
FIG. 1 is a partial plan view of the main part of a solid state image pickup device having CCDs (charge coupled device) of a interline transfer system.

FIG. 1 shows substantially the main portion of a solid state image pickup device using CCDs of an interline transfer system. The mode of operation of the solid state image pickup device according to a conventional method will be described. Signals or charges stored in photoelectric conversion elements 1, 3, 5, . . . of odd rows are transferred to readout sections 7 through transfer gates 6. The readout sections 7 output signals correspond to one field. Subsequently, signals or charges stored in photoelectric conversion elements 2, 4, . . . of even rows are transferred to the readout sections 7. Similarly, the readout sections 7 output signals correspond to the next field. According to this method, charges for signals corresponding to first and second fields are charges stored in the photoelectric conversion elements 1,3,5, . . . of odd rows and the photoelectric conversion elements 2, 4, . . . of even rows, respectively. These photoelectric conversion elements are adjacent to and independent of each other. These facts result in excellent resolution. As far as a single photoelectric conversion element is concerned, a signal is read out once in every other field. Therefore, a time interval for integrating the charges for the signals is twice that for reading out signals once in one field. According to the system of the National Television System Committee (NTSC), an integrating time interval for reading out the signals for one field is 16.7 msec. The integrating time interval becomes 33 msec according to the interlaced scanning described above. This method for driving the device is called a frame integration method.

However, the frame integration method has the following drawbacks.

First, during the integrating time interval, signal charges are continuously integrated. The length of the time interval is not important to reproduce a stationary object. However, when a moving object is reproduced, blur occurs as if the moving object were taken at a slow shutter speed, producing an afterimage. Second, the integrating time interval for the first field overlaps with that of the second field by 50%. Thus, 50% of the signals of the first field is contained in the second field. Therefore, when the moving object is reproduced, the afterimage is displayed.

In order to eliminate the afterimage, a field integration method for driving the device is proposed. For the first field, signal charges are simultaneously read out from the photoelectric conversion elements 2 of even rows and the photoelectric conversion elements 1 of odd rows, from the photoelectric conversion elements 4 of even rows and the photoelectric conversion elements 3 of odd rows, and so on. For the second field, signal charges are simultaneously read out from the photoelectric conversion elements 2 of even rows and the photoelectric conversion elements 3 of odd rows, from the photoelectric conversion elements 4 of the even rows and the photoelectric conversion elements 5 of odd rows, and so on.

According to the above method, because the signal charges are read out from the photoelectric conversion elements for each field, the integrating time interval (16.7 msec) in half of the integrating time interval of the frame integration method, thus reducing the afterimage effect. Further, the integrating time interval for the first field does not overlap that for the second field, eliminating the effective afterimage. However, the signal charges for the first and second fields are stored in the same photoelectric conversion elements, resulting in degradation of the resolution.

DESCRIPTION OF THE PREFERRED EMBODIMENTS

A method according to a first embodiment of the present invention will be described with reference to a photoelectric conversion device shown in FIG. 1.

First, signal charges stored in photoelectric conversion elements 2, 4, . . . , of each rows are read out therefrom and supplied to the readout sections 7. The readout signal charges are swept out with a sufficiently high frequency from the readout sections 7 or to discharge sections of the transferring stage in the readout sections. These charges are swept out at a relatively high frequency so as to complete, within the vertical blanking interval, transfer operations of the charges stored in the photoelectric conversion elements 1, 3, 5, . . . of odd rows. This sweeping out occurs just before the readout of odd signal charges by section 7, and further just before the detection section in the readout sections 7. Thus, the charges stored in the photoelectric conversion elements 1, 3, 5, . . . of odd rows are transferred to the readout sections 7 after the charges stored in photoelectric conversion elements 2, 4, 6, . . . of even rows are swept out. These odd signal charges are then transferred in the readout sections 7, and are sequentially detected by the detection sections to constitute the video signal of the first field. Similarly, during the next field interval, the charges stored in the photoelectric conversion elements 2, 4, . . . of even rows are read out therefrom and transferred to the readout sections 7 for detection by the detection section, after the charges stored in the photoelectric conversion elements 1, 3, 5, . . . of odd rows are read out and transferred to the readout sections 7 and swept out. As a result, these charges stored in the photoelectric conversion element constitute the second video signal of the second field. According to this method, all charges stored in the photoelectric conversion elements are read out or discharged once in each field. Thus, the integrating time interval becomes 16.7 msec. Therefore, the amount of the effective afterimage is equal to that in the field charge method. Further, charges which constitute the video signals of the first and second fields are independent of each other in the same manner as in the frame integration method, resulting in an excellent resolution as obtained in the frame integration method.

The method of the first embodiment of the present invention will be described with reference to timing charts of clock pulses.

Figure 2A:
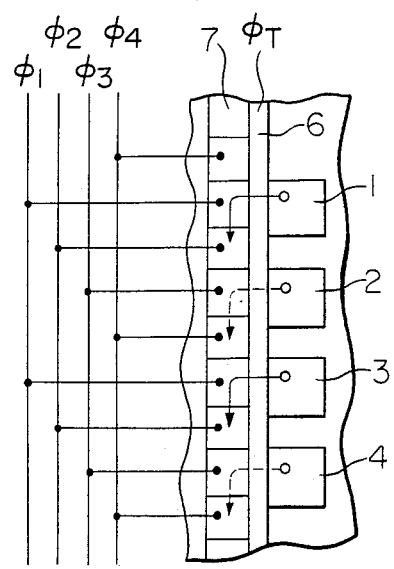
FIG. 2A is a partial plan view of a model of a solid state image pickup device having four-phase driven CCDs for the purpose of describing a mathod in detail according to a first embodiment of the present invention.
Figure 2B:
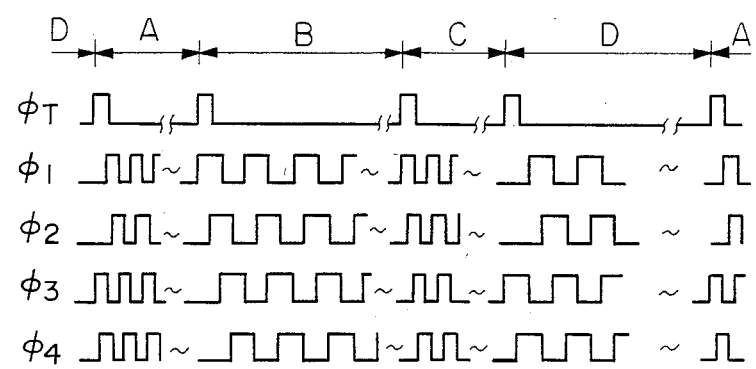
FIG. 2B is a timing diagram of clock pulses for driving the solid state image pickup device shown in FIG. 2A.

FIG. 2A is a partial view illustrating a model of an image pickup device using 4-phase driven CCDs as the readout section 7. FIG. 2B shows timing charts of the clock pulses for driving the device. Clock pulse $\phi_T$ is applied to the transfer gate 6. Clock pulses $\phi_1$, $\phi_2$, $\phi_3$ and $\phi_4$ are respectively applied to gate electrodes of the 4-phase CCD.

When the clock pulses $\phi_T$ and $\phi_3$ are maintained in positive voltage in a given time interval as is shown in the period A in FIG. 2B, charges stored in the photoelectric conversion elements 2, 4, 6, . . . of even rows are read out to a portion immediately below the gate portion to which the clock pulse $\phi_3$ is applied. After the transfer gates 6 are closed, the charges are sequentially transferred at a high frequency within the CCD and swept out (time interval A in FIG. 2B). Thereafter, when the clock pulses $\phi_T$ and $\phi_2$ are maintained in positive voltage in a given time interval, charges stored in the photoelectric conversion elements of odd rows are transferred to a portion immediately below the gate portion to which the clock pulse $\phi_1$ is applied. After the transfer gates 6 are closed, the charges are sequentially transferred within the readout sections 7 and are detected in the direction section (time interval B in FIG. 2B). Similarly, charges stored in the photoelectric conversion elements of odd rows are read out and swept out (time interval C in FIG. 2B). The charges stored in the photoelectric conversion elements of even rows are then read out and detected (time interval D in FIG. 2B).

Figure 3:
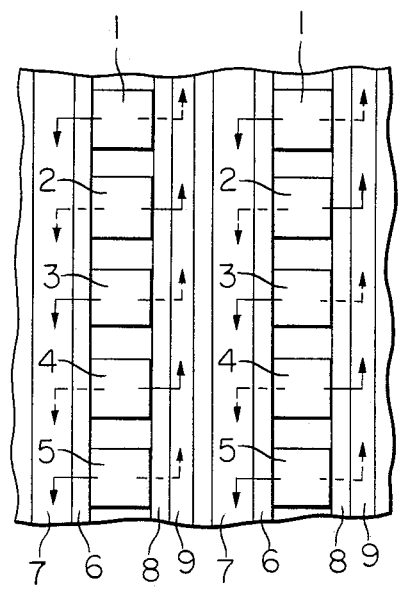
FIG. 3 is a partial plan view of a solid state image pickup device for the purpose of describing a method for driving said device according to a second embodiment of the present invention.

In the first embodiment described above, the charges for the non-readout field are swept out and then the charges for the readout field are read out. A method for driving the solid state image pickup device according to a second embodiment of the present invention will be described wherein the charges for the readout field are first read out and the charges for the non-readout field are then discharged. This method may be practiced by arranging discharge sections adjacent to the photoelectric conversion elements, as shown in FIG. 3. The discharge sections receive the excessive electric charge in the photoelectric conversion elements while charges are being stored therein and prevent blooming. According to this method, for the first field, charges stored in the photoelectric conversion elements 1, 3, 5, . . . of odd rows are read out to the readout sections 7 through the transfer gates 6. Then, a higher voltage is applied to overflow control gates 8 to discharge electric charges in the photoelectric conversion sections 2, 4, . . . , of even rows to overflow drains 9. Then the signal charges in the read-out section 7 are sequentially transferred to the detection section and are detected. Similarly, for the second field, the charges stored in the photoelectric conversion elements 2, 4, . . . of even rows are read out to the readout sections 7. Thereafter, a high voltage is applied to the overflow control gates 8 to discharge electric charge in the photelectric conversion elements 1, 3, 5, . . . of odd rows to the overflow drains 9.

Figure 4A:
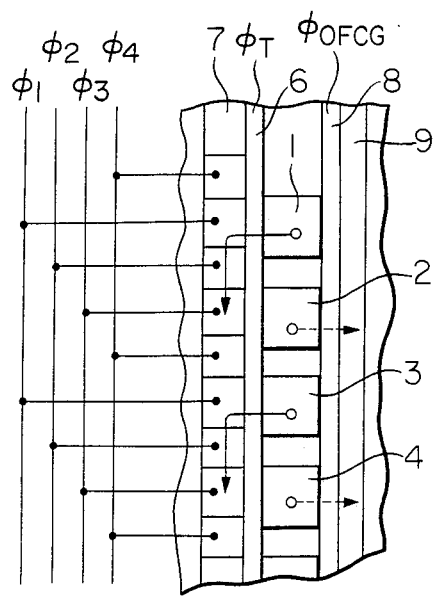
FIG. 4A is a partial plan view of a model of a solid state image pickup device having four-phase driven CCDs for the purpose of describing a method for driving the CCDs according to a second embodiment of the present invention.
Figure 4B:
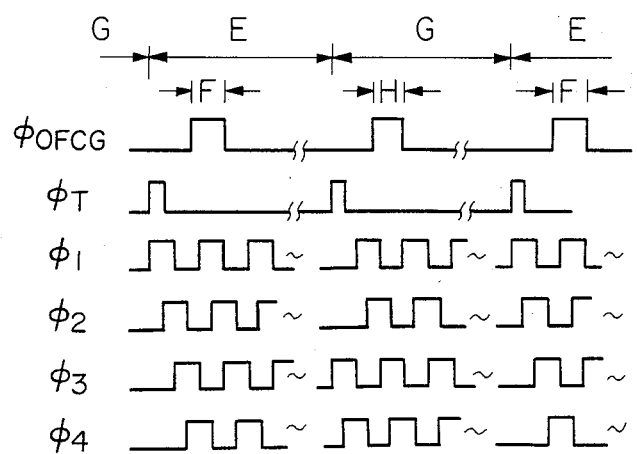
FIG. 4B is a timing diagram of clock pulses for driving the solid state image pickup device shown in FIG. 4A.

The method of the second embodiment of the present invention will be described with reference to timing charts of clock pulses. FIG. 4A shows a model of a solid state image pickup device using 4-phase CCDs as the readout sections 7. FIG. 4B shows timing charts of the clock pulses for driving the device. Clock pulse $\phi_{OFCG}$ is applied to the overflow control gates 8. When the clock pulses $\phi_T$ and $\phi_1$ are maintained in positive voltage in a given time interval, the charges stored in the photoelectric conversion elements of odd rows are transferred to a portion immediately below a gate portion ot which the clock pulse $\phi_1$ is applied. Thus, the transfer gates 6 are closed. The charges are then transferred within the CCDs to the output (time interval E in FIG. 4B). In this condition, when a higher positive voltage is applied to the overflow control gates 8 at a given time within the time interval E, charges in the photoelectric conversion elements of even rows (also those remaining charges in the photoelectric conversion elements of odd rows) are discharged to the overflow drains 9 (time interval F in FIG. 4B). Subsequently, in order to read out the charges stored in the photoelectric conversion elements of even rows, the clock pulse must be applied during the time interval G in FIG. 4B. In this case, discharge is performed in a time interval H (FIG. 4B) for which a higher positive voltage is applied to the overflow control gate 8. The time intervals for integrating the charges stored in the photoelectric conversion elements of even and odd rows are from the end of the time interval F to the beginning of the time interval G and from the end of the time interval H to the beginning of the time interval E, respectively. The integrating time interval can be controlled by adjusting the trailing edge of the clock pulse $\phi_{OFCG}$ for further reduction of the effective afterimage.

In the above embodiments, the 4-phase driven CCDs are used. However, 2-phase driven CCDs, BBDs, and MOS switching transistors may be used to obtain the same effects.

Further, in the above embodiments, the CCDs of the interline transfer system are used. However, a solid state image pickup device using MOS switching transistors may be used as a readout means for reading out signals from the photoelectric conversion elements.

We claim:

1. A method for driving a solid state image pick-up device having photoelectric conversion elements arranged in a row direction, comprising the steps of:
    reading out, for discharging, signal charges stored in a first group of alternate rows of photoelectric conversion elements during a first field interval;
    reading out, for detection, signal charges stored in a second group of the remaining alternate rows of photoelectric conversion elements during said first field interval;
    reading out, for discharging, signal charges stored in said second group of photoelectric conversion elements during a subsequent second field interval; and
    reading out, for detection, signal charges stored in said first group of photoelectric conversion elements during said second field interval.

2. A method according to claim 1, wherein said solid state image pickup device includes charge coupled devices of an interline transfer system.

3. A method for driving a solid state image pick-up device having photoelectric conversion elements arranged in a row direction, comprising the steps of:
    reading out, for detection, signal charges stored in a first group of alternate rows of photoelectric conversion elements during a first field interval;
    reading out, for discharging, signal charges stored in a second group of the remaining alternate rows of photoelectric conversion elements during said first field interval;
    reading out, for detection, signal charges stored in said second group of photoelectric conversion elements during a subsequent second field interval; and
    reading out, for discharging, signal charges stored in first group of photoelectric conversion elements during said second field interval.

4. A method according to claim 3, wherein said solid state image pick-up device includes charge coupled devices of an interline transfer system.

* * * * *